US012319151B2

(12) United States Patent
Gilbert-Eyres et al.

(10) Patent No.: US 12,319,151 B2
(45) Date of Patent: Jun. 3, 2025

(54) SMART VEHICLE SYSTEMS AND CONTROL LOGIC FOR BATTERY THERMAL EVENT DETECTION AND SITUATIONAL SEVERITY ASSESSMENT

(71) Applicant: GM GLOBAL TECHNOLOGY OPERATIONS LLC, Detroit, MI (US)

(72) Inventors: Matthew E. Gilbert-Eyres, Rochester, MI (US); Russell A. Patenaude, Macomb Township, MI (US); Eric T. Hosey, Royal Oak, MI (US); Matthew Neely, Rochester, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 568 days.

(21) Appl. No.: 17/839,988

(22) Filed: Jun. 14, 2022

(65) Prior Publication Data

US 2023/0398872 A1     Dec. 14, 2023

(51) Int. Cl.
*B60L 3/00* (2019.01)
*B60Q 1/50* (2006.01)
(Continued)

(52) U.S. Cl.
CPC .............. *B60L 3/0046* (2013.01); *B60Q 1/50* (2013.01); *B60Q 1/52* (2013.01); *B60Q 5/005* (2013.01);
(Continued)

(58) Field of Classification Search
CPC ............. B60L 3/0046; B60L 2240/545; G01R 31/392; G01R 31/396; H01M 10/486;
(Continued)

(56) References Cited

U.S. PATENT DOCUMENTS

| 4,350,026 | A  | 9/1982 | Klein |
| 6,889,515 | B2 | 5/2005 | Tilton et al. |

(Continued)

FOREIGN PATENT DOCUMENTS

| CN | 113400940 A | * | 9/2021 | ............ B60L 3/0046 |
| CN | 114074550 A | * | 2/2022 | |
| CN | 116298954 A | * | 6/2023 | |

OTHER PUBLICATIONS

CN 113400940 A—machine translation (Year: 2021).*
CN 114074550 A—machine translation (Year: 2022).*
CN 116298954 A—machine translation (Year: 2023).*

*Primary Examiner* — Dino Kujundzic
(74) *Attorney, Agent, or Firm* — Quinn IP Law

(57) ABSTRACT

Presented are smart vehicle systems and control logic for battery thermal event detection and severity assessment, methods for making/using such systems, and vehicles equipped with such systems. A method of operating a vehicle includes a resident or remote vehicle controller detecting a thermal event in at least one battery cell in the vehicle's battery system and, upon detection, monitoring the vehicle's surrounding area to detect target objects near the vehicle. Responsive to detecting any target objects near the vehicle, the controller aggregates target object data, including a total number of detected target objects and respective proximities of the detected target objects to the vehicle. Using this target object data, a situational severity level is estimated for the thermal event; the controller determines if the severity level exceeds a maximum allowable severity level. If so, the controller responsively commands a vehicle subsystem to execute a control operation to mitigate the event.

20 Claims, 3 Drawing Sheets

(51) Int. Cl.
  *B60Q 1/52*   (2006.01)
  *B60Q 5/00*   (2006.01)
  *G01R 31/392*  (2019.01)
  *G01R 31/396*  (2019.01)
  *H01M 10/48*   (2006.01)
  *H01M 50/204*  (2021.01)

(52) U.S. Cl.
  CPC ......... *G01R 31/392* (2019.01); *G01R 31/396* (2019.01); *H01M 10/486* (2013.01); *H01M 50/204* (2021.01); *H01M 2220/20* (2013.01)

(58) Field of Classification Search
  CPC ........... H01M 50/204; H01M 2220/20; H01M 2010/4271; B60Q 1/52
  See application file for complete search history.

(56) References Cited

U.S. PATENT DOCUMENTS

| | | | |
|---|---|---|---|
| 6,955,063 B2 | 10/2005 | Adiga et al. | |
| 8,329,325 B2 | 12/2012 | Brodie et al. | |
| 8,383,260 B2 | 2/2013 | Essinger et al. | |
| 8,435,668 B2 | 5/2013 | Kumar et al. | |
| 8,563,154 B2 | 10/2013 | Graban et al. | |
| 8,852,772 B2 | 10/2014 | McDonald | |
| 8,951,654 B2 | 2/2015 | Sachdev et al. | |
| 9,196,939 B2 | 11/2015 | Christian et al. | |
| 9,689,624 B2 | 6/2017 | Timmons et al. | |
| 10,270,123 B2 | 4/2019 | Schilder et al. | |
| 10,923,287 B1 | 2/2021 | Coppola et al. | |
| 2009/0249807 A1 | 10/2009 | Nemesh et al. | |
| 2011/0200860 A1 | 8/2011 | Brodie et al. | |
| 2015/0132616 A1* | 5/2015 | Sahner | H01M 10/48 429/61 |
| 2016/0090105 A1* | 3/2016 | Neubecker | A62C 3/07 701/1 |
| 2018/0201187 A1* | 7/2018 | Yellambalase | B60L 50/51 |
| 2019/0357386 A1 | 11/2019 | Coppola et al. | |
| 2020/0086152 A1* | 3/2020 | Stadler | B60L 50/64 |
| 2020/0130771 A1* | 4/2020 | Jacobsz Rosier | B62J 45/20 |
| 2021/0245627 A1* | 8/2021 | Ferguson | G05D 1/0291 |
| 2022/0102780 A1 | 3/2022 | Hickey et al. | |
| 2022/0398881 A1* | 12/2022 | Landvik | G07C 5/0833 |

\* cited by examiner

SMART VEHICLE SYSTEMS AND CONTROL LOGIC FOR BATTERY THERMAL EVENT DETECTION AND SITUATIONAL SEVERITY ASSESSMENT

INTRODUCTION

The present disclosure relates generally to electrochemical devices. More specifically, aspects of this disclosure relate to smart vehicle systems and control logic for detecting and responding to severe thermal events in rechargeable traction battery packs.

Current production motor vehicles, such as the modern-day automobile, are originally equipped with a powertrain that operates to propel the vehicle and power the vehicle's onboard electronics. In automotive applications, for example, the vehicle powertrain is generally typified by a prime mover that delivers driving torque through an automatic or manually shifted power transmission to the vehicle's final drive system (e.g., differential, axle shafts, corner modules, road wheels, etc.). Automobiles have historically been powered by a reciprocating-piston type internal combustion engine (ICE) assembly due to its ready availability and relatively inexpensive cost, light weight, and overall efficiency. Such engines include compression-ignited (CI) diesel engines, spark-ignited (SI) gasoline engines, two, four, and six-stroke architectures, and rotary engines, as some non-limiting examples. Hybrid-electric and full-electric vehicles (collectively "electric-drive vehicles"), on the other hand, utilize alternative power sources to propel the vehicle and, thus, minimize or eliminate reliance on a fossil-fuel based engine for tractive power.

A full-electric vehicle (FEV)—colloquially labeled an "electric car"—is a type of electric-drive vehicle configuration that altogether omits an internal combustion engine and attendant peripheral components from the powertrain system, relying instead on a rechargeable energy storage system (RESS) and a traction motor for vehicle propulsion. The engine assembly, fuel supply system, and exhaust system of an ICE-based vehicle are replaced with a single or multiple traction motors, a traction battery pack, and battery cooling and charging hardware in a battery-based FEV. Hybrid-electric vehicle (HEV) powertrains, in contrast, employ multiple sources of tractive power to propel the vehicle, most commonly operating an ICE assembly in conjunction with a battery-powered or fuel-cell-powered traction motor. Since hybrid-type, electric-drive vehicles are able to derive their power from sources other than the engine, HEV engines may be turned off, in whole or in part, while the vehicle is propelled by the electric motor(s).

High-voltage (HV) electrical systems govern the transfer of electricity between each traction motor and the rechargeable energy storage system that supplies the requisite power for operating many hybrid-electric and full-electric powertrains. For battery-electric vehicles (BEV), the RESS is generally composed of one or more high-energy density, high-capacity traction battery packs that stack or cluster battery cells into a shared pack housing or into individual battery modules. Located on a battery side of the HV electrical system is a front-end DC-to-DC power converter that is connected to the traction battery pack(s) in order to increase the supply of voltage to a main DC bus and a DC-to-AC power inverter module (PIM). The traction PIM is an electronic switching device for converting the DC output of the battery pack(s) into an alternating current (AC) input for powering the multi-phase motor(s). A high-frequency bulk capacitor may be arranged across the positive and negative terminals of the main DC bus to provide electrical stability and store supplemental electrical energy. A dedicated Electronic Battery Control Module (EBCM), through collaborative operation with a Powertrain Control Module (PCM) and each motor's power electronics package, governs operation of the battery pack(s) and traction motor(s).

The individual cells of a battery pack may generate a significant amount of heat during the pack's charge and discharge cycles. This cell-borne heat is primarily caused by exothermic chemical reactions and losses due to activation energy, chemical transport, and resistance to ionic migration. Within lithium-class batteries, a series of exothermic and gas-generating reactions may take place as cell temperatures rise and the battery assembly is pushed towards an unstable state. Such thermal events, if left unchecked, may lead to a more accelerated heat-generating state called "thermal runaway," a condition in which the battery system is incapable of returning the internal battery components to a normal operating temperature. An integrated battery cooling system may be employed to prevent these undesirable overheating conditions within such battery packs. Active thermal management (ATM) systems, for example, employ a central controller or dedicated control module to regulate operation of a cooling circuit that circulates coolant fluid through the heat-producing battery components. For indirect liquid cooling systems, a heat-transfer coolant is circulated through a network of internal channels and pipes within the battery case. In contrast, direct liquid cooling systems—or "liquid immersion cooling" (LIC) systems—immerse the battery cells within a direct-conduction dielectric coolant.

SUMMARY

Presented herein are smart vehicle systems with attendant control logic for battery thermal event detection and situational severity assessment, methods and computer-readable media for operating such vehicle systems, and motor vehicles equipped with such smart systems. By way of example, there are disclosed systems and methods for generating proximity alerts for nearby vehicle users, bystanders, vehicles, etc., with a concomitant assessment of the situational severity of a detected battery thermal event. Using wireless short-range communications (SRC) devices (e.g., BLUETOOTH®, Zigbee, NFC, V2X, etc.) and/or long-range communications (LRC) devices (e.g., Wi-Fi, GPS, cellular, etc.), a host vehicle undergoing a thermal event will automate detection of nearby individuals, vehicles, and other potentially affected entities (collectively "target objects"). From this aggregated data, the host vehicle creates a list of likely impacted target objects determined to be within a predefined proximity of the thermal event (e.g., as delineated by a virtual geofence). The host vehicle will transmit alerts to the impacted target objects(s) that notify them of the potential risk to themselves and/or their vehicles. As another option, the host vehicle may automate the vehicle's audio system, horn system, lamp system, etc. to output a predetermined audible and/or visible output designed to warn proximal target objects of the thermal event. Additionally, the in-vehicle telematics unit and/or digital instrument cluster may display a warning for vehicle occupants to vacate the passenger compartment.

Upon detection of a thermal event, the host vehicle may begin aggregating data about the location, type, and seriousness of the event, the location of the vehicle (e.g., indoors vs. outdoors, rural vs urban, moving vs. stationary, etc.), the number and type of impacted target objects, the respective proximities of the individual target objects, etc. Using this collected data, the host vehicle or a remote back-office (BO) host service communicating with the host vehicle may derive a "situational severity level" for the thermal event. For example, if the host vehicle is undergoing a thermal runaway event and is surrounded by numerous vehicles and pedestrians in an urban setting, the situational severity level may be marked as "high". Comparatively, if the host vehicle is undergoing a thermal runaway event and is outdoors in a rural area with few or no nearby target objects, the situational severity level may be marked as "low". This estimated situational severity level may be transmitted to first responders and/or other interested parties.

Aspects of this disclosure are directed to smart vehicle systems, system control logic, and memory-stored instructions for battery thermal event detection and situational severity assessment. In an example, a method is presented for operating a vehicle with a battery system having multiple battery cells. This representative method includes, in any order and in any combination with any of the above and below disclosed options and features: detecting, e.g., via a resident or remote vehicle controller or network of controllers (collectively "controller"), occurrence of a thermal event in at least one of the battery cells in the vehicle's battery system; monitoring, e.g., via the controller responsive to the detected thermal event using one or more on-vehicle sensing devices and/or wireless communications devices, a surrounding area of the vehicle to detect target objects, if any, near the vehicle; determining, e.g., via the controller and/or a remote host vehicle service responsive to detecting any target objects near the vehicle, target object data including a total number of detected target objects and a respective proximity of each detected target object to the vehicle; estimating, e.g., via the controller/host service using the target object data, a situational severity level for the event; determining, e.g., via the controller/host service, if the situational severity level exceeds a preset maximum allowable severity level; and transmitting, e.g., via the controller responsive to the severity level exceeding the maximum allowable severity level, one or more command signals to one or more resident vehicle subsystems to execute one or more control operations to mitigate the thermal event.

Aspects of this disclosure are also directed to computer-readable media (CRM) for thermal event detection and severity level estimation for a battery system. In an example, a non-transitory CRM stores instructions executable by one or more processors of a resident or remote vehicle controller or controller network. These instructions, when executed by the processor(s), cause the controller to perform operations, including: detecting occurrence of a thermal event in at least one battery cell in a battery system of a vehicle; monitoring, responsive to detecting the thermal event, a surrounding area of the vehicle using a wireless communications device and/or a sensing device to detect target objects, if any, near the vehicle; determining, responsive to detecting at least one of the target objects near the vehicle, target object data including a total number of the detected target objects and a respective proximity of each of the detected target objects to the vehicle; estimating a situational severity level for the thermal event using the target object data; determining if the situational severity level exceeds a preset maximum allowable severity level; and transmitting, responsive to the situational severity level exceeding the preset maximum allowable severity level, a command signal to a resident vehicle subsystem to execute a control operation to mitigate the thermal event.

Additional aspects of this disclosure are directed to motor vehicles equipped with traction battery packs and battery systems provisioning thermal event detection and severity assessment capabilities. As used herein, the terms "vehicle" and "motor vehicle" may be used interchangeably and synonymously to include any relevant vehicle platform, such as passenger vehicles (ICE, REV, FEV, fuel cell, fully and partially autonomous, etc.), commercial vehicles, industrial vehicles, tracked vehicles, off-road and all-terrain vehicles (ATV), motorcycles, farm equipment, e-bikes, e-scooters, watercraft, aircraft, etc. Disclosed features may be similarly applicable to automotive and non-automotive applications alike. In an example, a motor vehicle includes a vehicle body with a passenger compartment, multiple road wheels mounted to the vehicle body (e.g., via corner modules coupled to a unibody or body-on-frame chassis), and other standard original equipment. For electric-drive vehicle applications, one or more electric traction motors operate alone (e.g., for FEV powertrains) or in conjunction with an internal combustion engine assembly (e.g., for HEV powertrains) to selectively drive one or more of the road wheels to propel the vehicle. A rechargeable traction battery pack containing multiple battery cells is mounted onto the vehicle body and operable to power the traction motor(s).

Continuing with the discussion of the preceding example, the vehicle also includes a vehicle controller that is programmed to detect the occurrence of a thermal event in at least one of the battery cells (e.g., based on sensor data received from one or more battery system sensors). Responsive to detecting the thermal event, the controller monitors a surrounding area of the vehicle (e.g., using data received from one or more vehicle sensing devices and/or wireless communications devices) to detect target objects, if any, near the vehicle. Upon detection of the target object(s) near the vehicle, the controller responsively determines target object data, including a total number of detected target objects and a respective proximity of each detected target object to the vehicle. The controller, alone or in cooperation with a remote BO host service, estimates a situational severity level for the thermal event using the target object data. If this estimated severity level exceeds a preset maximum allowable severity level, the controller responsively commands one or more resident vehicle subsystems to execute one or more control operations to mitigate the event.

For any of the disclosed methods, systems, CRM, and vehicles, the controller may determine, for each detected target object, if the respective proximity thereof is within a preset proximity limit of the vehicle. In this instance, the total number of detected target objects corresponds to a mathematical sum of the detected target objects that are within the preset proximity limit of the vehicle. This preset proximity limit may be delineated by a virtual geofence that is actively generated by the vehicle. In this example, the controller may determine an event type of the thermal event and, based on the event type, modify the size (e.g., a diameter, width, surface area, volume, etc.) of the virtual geofence.

For any of the disclosed methods, systems, CRM, and vehicles, estimating the thermal event's situational severity level may include: (1) determining if the total number of detected target objects is less than a first threshold impact value and, if so, setting the situational severity level to a first severity level; (2) responsive to the total number of detected target objects being greater than the first threshold impact value, determining if the total number is less than a second threshold impact value and, if so, setting the situational severity level to a second severity level; and (3) responsive to the total number of detected target objects being greater than the second threshold impact value, determining if the total number is less than a third threshold impact value and, if so, setting the situational severity level to a third severity level. In this instance, the third threshold impact value is greater than the second threshold impact value, and the second threshold impact value is greater than the first threshold impact value. Likewise, the third severity level is greater than the second severity level, both of which are greater than the first severity level.

For any of the disclosed methods, systems, CRM, and vehicles, estimating a situational severity level for a thermal event may include a vehicle controller transmitting target object data to a remote back-office host service, and thereafter receiving an estimation of the situational severity level from the BO host service. As another option, target object data may include and desired combination of relevant data, including a location of the host vehicle, a respective target type for each detected target object, etc. To detect a thermal event, a vehicle controller may communicate with one or more battery system sensors to receive sensor data that is indicative of a system fault in the battery system. Using this sensor data, the controller determines a fault type and a fault location of the system fault, and concomitantly determines if the fault location is within at least one of the battery cells and if the fault type is indicative of any one of multiple predefined battery thermal events. The detected thermal event may be a thermal runaway event in which one or more of the battery cells have entered an uncontrolled heat-generating cycle that is causing an unstable self-heating state.

For any of the disclosed methods, systems, CRM, and vehicles, the resident vehicle subsystem may include a vehicle lamp component (e.g., front and rear headlamps) and/or a vehicle display component (e.g., in-vehicle telematics unit or digital IC). In this instance, the control operation includes the lamp component and/or the display component outputting a predefined visible output that alerts the detected target objects of the thermal event. As another option, the resident vehicle subsystem may include a vehicle audio component (e.g., audio system speaker) and/or a vehicle horn component (e.g., car horn). In this instance, the control operation includes the audio component and/or the horn component outputting a predefined audible output that alerts the detected target objects of the thermal event. Other optional vehicle-automated responses to a detected battery thermal event may include: (1) triggering an in-vehicle ATM system to cool the battery cell(s); (2) electrically disconnecting the battery pack from all electrical loads; (3) unlocking and/or opening the vehicle doors; (4) transmitting an alert to the owner of the host vehicle; and/or (5) transmitting an alert to first responders with vehicle location, event type, and event severity information.

The above Summary does not represent every embodiment or every aspect of the present disclosure. Rather, the foregoing summary merely provides a synopsis of some of the novel concepts and features set forth herein. The above features and advantages, and other features and attendant advantages of this disclosure, will be readily apparent from the following Detailed Description of illustrated examples and representative modes for carrying out the disclosure when taken in connection with the accompanying drawings and appended claims. Moreover, this disclosure expressly includes any and all combinations and subcombinations of the elements and features presented above and below.

Figure 1:
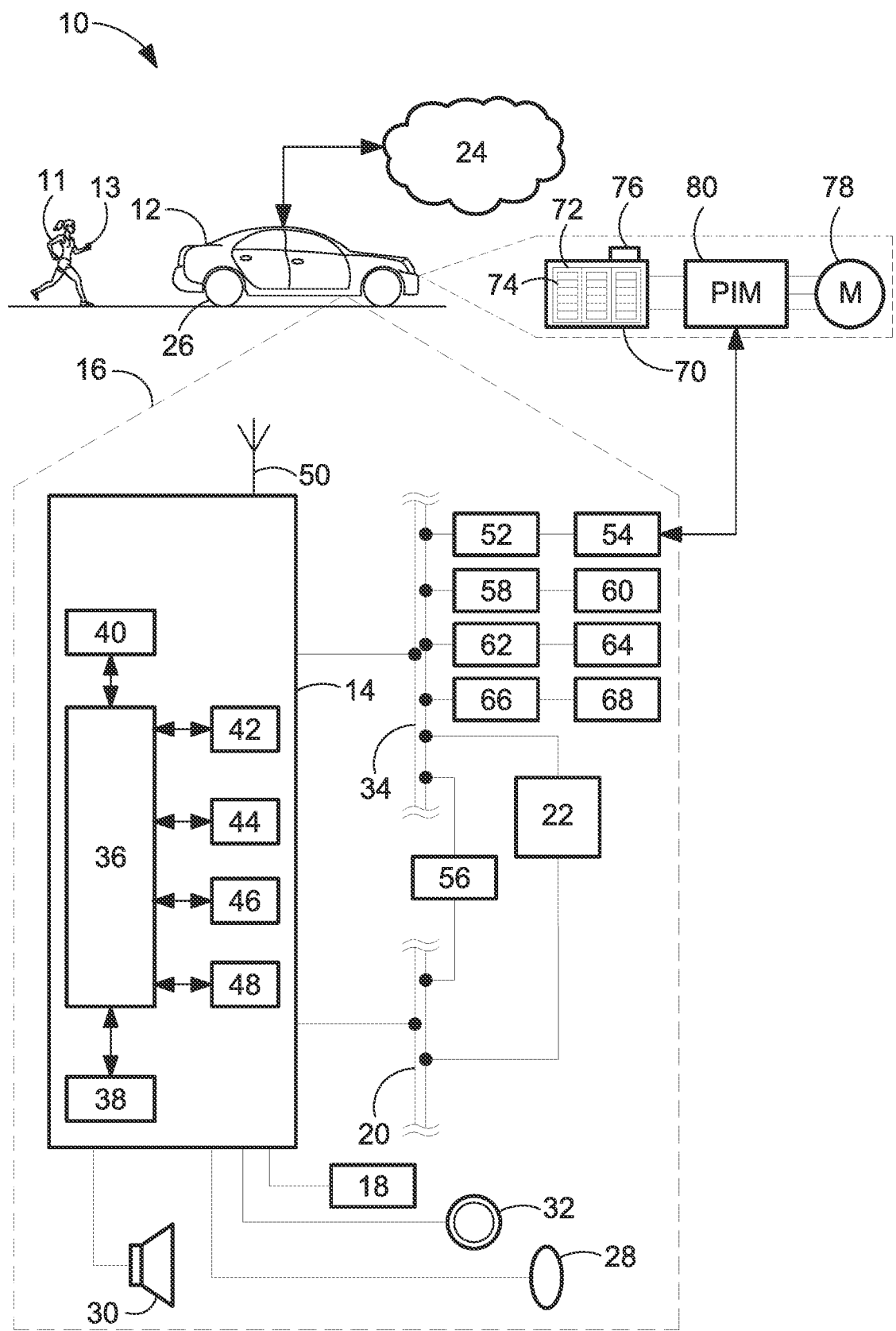
FIG. 1 is a partially schematic, side-view illustration of a representative vehicle with an electrified powertrain, a rechargeable energy storage system, and a network of in-vehicle controllers, sensing device, and communication devices for detecting thermal events and automating proximity alerts to select target objects in accord with aspects of the disclosed concepts.

The present disclosure is amenable to various modifications and alternative forms, and some representative embodiments are shown by way of example in the drawings and will be described in detail herein. It should be understood, however, that the novel aspects of this disclosure are not limited to the particular forms illustrated in the above-enumerated drawings. Rather, this disclosure covers all modifications, equivalents, combinations, permutations, groupings, and alternatives falling within the scope of this disclosure as encompassed, for example, by the appended claims.

DETAILED DESCRIPTION

This disclosure is susceptible of embodiment in many different forms. Representative embodiments of the disclosure are shown in the drawings and will herein be described in detail with the understanding that these embodiments are provided as an exemplification of the disclosed principles, not limitations of the broad aspects of the disclosure. To that extent, elements and limitations that are described, for example, in the Abstract, Introduction, Summary, and Detailed Description sections, but not explicitly set forth in the claims, should not be incorporated into the claims, singly or collectively, by implication, inference or otherwise.

For purposes of the present detailed description, unless specifically disclaimed: the singular includes the plural and vice versa; the words "and" and "or" shall be both conjunctive and disjunctive; the words "any" and "all" shall both mean "any and all"; and the words "including," "containing," "comprising," "having," and the like, shall each mean "including without limitation." Moreover, words of approximation, such as "about," "almost," "substantially," "generally," "approximately," and the like, may each be used herein in the sense of "at, near, or nearly at," or "within 0-5% of," or "within acceptable manufacturing tolerances," or any logical combination thereof, for example. Lastly, directional adjectives and adverbs, such as fore, aft, inboard, outboard, starboard, port, vertical, horizontal, upward, downward, front, back, left, right, etc., may be with respect to a motor vehicle, such as a forward driving direction of a motor vehicle when the vehicle is operatively oriented on a horizontal driving surface.

Referring now to the drawings, wherein like reference numbers refer to like features throughout the several views, there is shown in FIG. 1 a representative automobile, which is designated generally at 10 and portrayed herein for purposes of discussion as a sedan-style, electric-drive passenger vehicle. The illustrated automobile 10—also referred to herein as "motor vehicle" or "vehicle" for short—is merely an exemplary application with which novel aspects of this disclosure may be practiced. In the same vein, incorporation of the present concepts into an FEV powertrain should be appreciated as a non-limiting implementation of disclosed features. As such, it will be understood that aspects and features of this disclosure may be applied to other powertrain architectures, incorporated into any logically relevant type of motor vehicle, and utilized for both automotive and non-automotive applications alike. Moreover, only select components of the motor vehicles and battery systems are shown and described in additional detail herein. Nevertheless, the vehicles, systems and assemblies discussed below may include numerous additional and alternative features, and other available peripheral components, for carrying out the various methods and functions of this disclosure.

The representative vehicle 10 of FIG. 1 is originally equipped with a vehicle telecommunication and information ("telematics") unit 14 that wirelessly communicates, e.g., via cell towers, base stations, mobile switching centers, satellite service, etc., with a remotely located or "off-board" cloud computing host service 24 (e.g., ONSTAR®). Some of the other vehicle hardware components 16 shown generally in FIG. 1 include, for example, a video display device 18, a microphone 28, audio speakers 30, and assorted user input controls 32 (e.g., buttons, knobs, switches, touchpads, joysticks, touchscreens, etc.). Microphone 28 provides a vehicle occupant with means to input verbal or other auditory commands; the vehicle 10 may be equipped with an embedded voice-processing unit utilizing audio filtering, editing, and analysis modules. Vehicle speakers 30 provide audible output to a vehicle occupant and may be either a stand-alone speaker dedicated for use with the telematics unit 14 or may be part of an audio system 22. The audio system 22 is operatively connected to a network connection interface 34 and an audio bus 20 to receive analog information, rendering it as sound, via one or more speaker components.

Communicatively coupled to the telematics unit 14 is a network connection interface 34, suitable examples of which include twisted pair/fiber optic Ethernet switches, parallel/serial communications buses, local area network (LAN) interfaces, controller area network (CAN) interfaces, and the like. The network connection interface 34 enables the vehicle hardware 16 to send and receive signals with one another and with various systems and subsystems both onboard and off-board the vehicle body 12. This allows the vehicle 10 to perform assorted vehicle functions, such as modulating powertrain output, governing operation of the vehicle's transmission, activating the friction and regenerative brake systems, controlling vehicle steering, regulating charge and discharge of the vehicle's battery pack(s), and other automated functions. For instance, telematics unit 14 receives and transmits signals and data to/from a Powertrain Control Module (PCM) 52, an Advanced Driver Assistance System (ADAS) module 54, an Electronic Battery Control Module (EBCM) 56, a Steering Control Module (SCM) 58, and assorted other vehicle ECUs 60, such as a transmission control module (TCM), engine control module (ECM), Sensor System Interface Module (SSIM), etc.

With continuing reference to FIG. 1, telematics unit 14 is an onboard computing device that provides a mixture of services, both individually and through its communication with other networked devices. This telematics unit 14 is generally composed of one or more processors 40, each of which may be embodied as a discrete microprocessor, an application specific integrated circuit (ASIC), or a dedicated control module. Vehicle 10 may offer centralized vehicle control via a central processing unit (CPU) 36 that is operatively coupled to a real-time clock (RTC) 42 and one or more electronic memory devices 38, each of which may take on the form of a CD-ROM, magnetic disk, IC device, flash memory, semiconductor memory (e.g., various types of RAM or ROM), etc.

Wireless long-range communication (LRC) capabilities with remote, off-board devices may be provided via one or more of a cellular chipset/component, a navigation and location chipset/component (e.g., global positioning system (GPS) transceiver), or a wireless modem, all of which are collectively represented at 44 in FIG. 1. Wireless short-range communication (SRC) connectivity may be provided via a short-range wireless communications device 46 (e.g., a BLUETOOTH® unit, radio frequency identification (RFID) tag/reader, or near field communications (NFC) transceiver, etc.), a dedicated short-range communications (DSRC) component 48, and/or a dual antenna 50. The communications devices described above may provision data exchanges as part of a periodic broadcast in a vehicle-to-vehicle (V2V) communication system or a vehicle-to-everything (V2X) communication system, e.g., Vehicle-to-Pedestrian (V2P), etc.

CPU 36 receives sensor data from one or more sensing devices that use, for example, photo detection, radar, laser, ultrasonic, optical, infrared, or other suitable technology, including short range communications technologies (e.g., DSRC) or Ultra-Wide Band (UWB) radio technologies, e.g., for executing an automated vehicle operation or a vehicle navigation service. In accord with the illustrated example, the automobile 10 may be equipped with one or more digital cameras 62, one or more range sensors 64, one or more vehicle speed sensors 66, one or more vehicle dynamics sensors 68, and any requisite filtering, classification, fusion, and analysis hardware and software for processing raw sensor data. The type, placement, number, and interoperability of the distributed array of in-vehicle sensors may be adapted, singly or collectively, to a given vehicle platform, e.g., for achieving a desired level of autonomous vehicle operation.

To propel the motor vehicle 10, an electrified powertrain is operable to generate and deliver tractive torque to one or more of the vehicle's drive wheels 26. The powertrain is generally represented in FIG. 1 by a rechargeable energy storage system (RES S), which may be in the nature of a chassis-mounted traction battery pack 70, that is operatively connected to an electric traction motor 78. The traction battery pack 70 may be generally composed of one or more battery modules 72, each of which contains a group of battery cells 74, such as lithium ion, lithium polymer, lithium metal, or nickel metal hydride battery cells of the pouch, can, or prismatic type. One or more electric machines, such as traction motor/generator (M) units 78, draw electrical power from and, optionally, deliver electrical power to the battery pack 70. A power inverter module (PIM) 80 electrically connects the battery pack(s) 70 to the motor/generator unit(s) 78 and modulates the transfer of electrical current therebetween. Disclosed concepts are similarly applicable to HEV and ICE-based powertrains, as well as RESS architectures employing EVB's with a shared pack housing.

The battery pack 70 may be configured such that module management, cell sensing, and module-to-module or module-to-host communication functionality is integrated directly into each battery module 72 and performed wired or wirelessly via an on-pack cell monitoring unit (CMU) 76. The CMU 76 may be a wireless-enabled, microcontroller-based, printed circuit board (PCB)-mounted sensor array. Each CMU 76 may have a GPS transceiver and RF capabilities and may be packaged on or in a battery module housing. The battery module cells 74, CMU 76, housing, coolant lines, busbars, etc., collectively define the cell module assembly.

Figure 2:
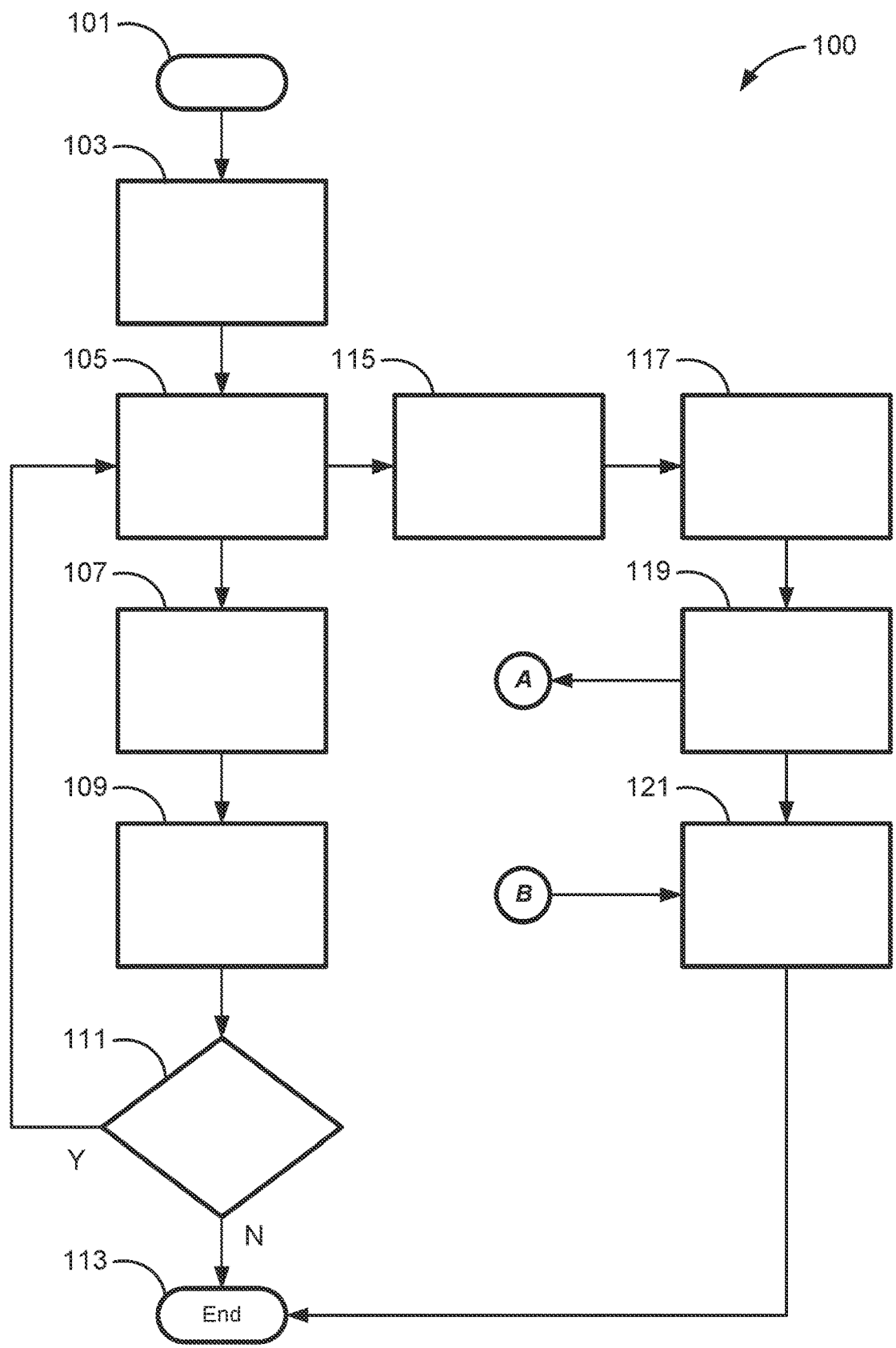
FIG. 2 is a flowchart illustrating a representative thermal event detection and proximity alert transmission algorithm for traction battery packs of electric-drive vehicles, which may correspond to memory-stored instructions that are executable by a resident or remote controller, control-logic circuit, programmable control unit, or other integrated circuit (IC) device or network of devices in accord with aspects of the disclosed concepts.
Figure 3:
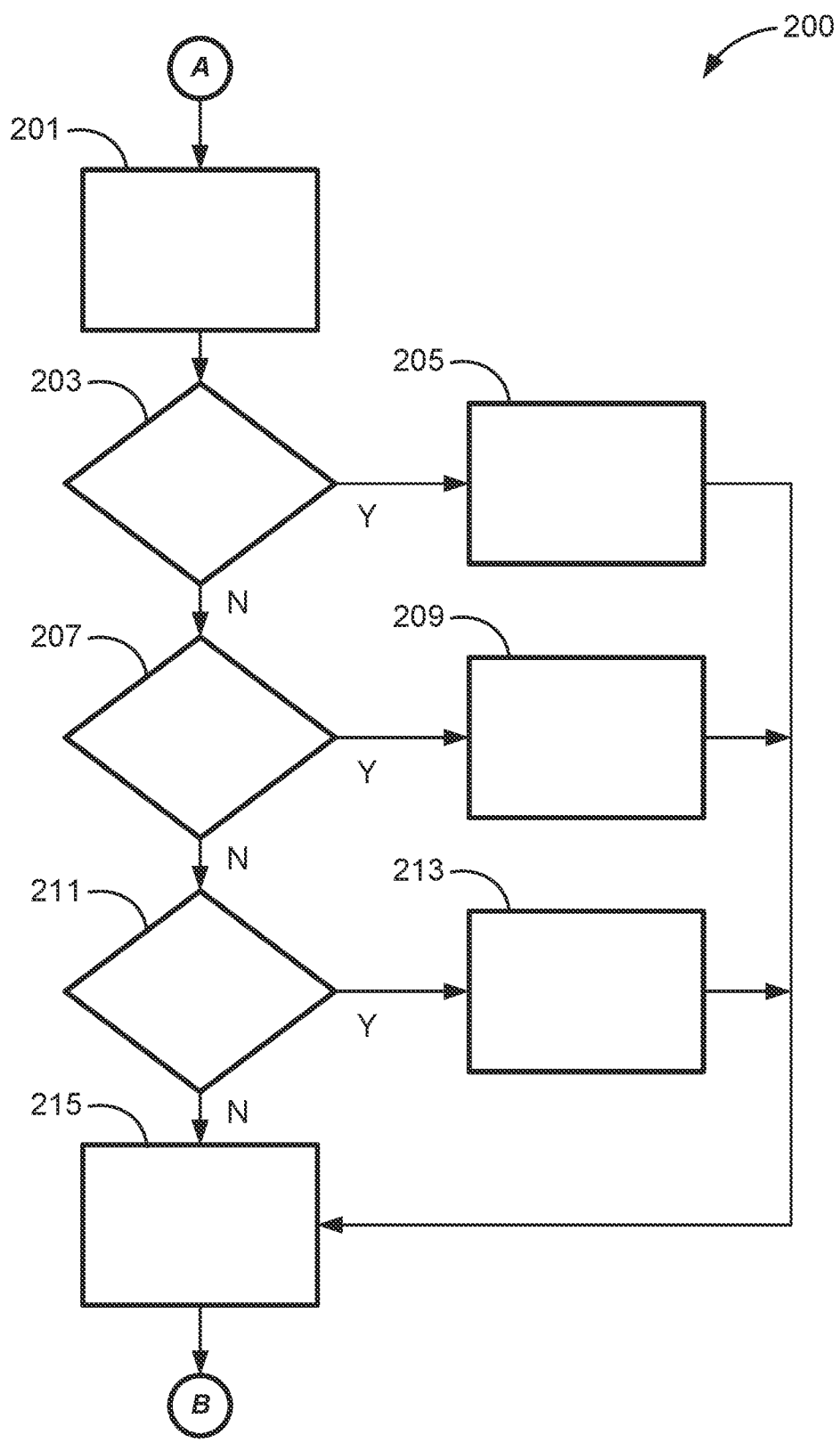
FIG. 3 is a flowchart illustrating a representative thermal event situational severity analysis algorithm for traction battery packs of electric-drive vehicles, which may correspond to memory-stored instructions that are executable by a resident or remote controller, control-logic circuit, programmable control unit, or other integrated circuit (IC) device or network of devices in accord with aspects of the disclosed concepts.

With reference next to the flow chart of FIG. 2, an improved method or control strategy for automated thermal event detection and proximity alert transmission for a battery system, such as battery pack 70 of automobile 10 in FIG. 1, is generally described at 100 in accordance with aspects of the present disclosure. Generally designated at 200 in FIG. 3 is an improved method or control strategy for thermal event severity analysis for a battery system, such as RESS battery pack 70. Some or all of the operations illustrated in FIGS. 2 and 3 and described in further detail below may be representative of an algorithm that corresponds to processor-executable instructions that are stored, for example, in main or auxiliary or remote memory (e.g., memory device 38 of FIG. 1), and executed, for example, by an electronic controller, processing unit, logic circuit, or other module or device or network of modules/devices (e.g., CPU 36 and/or cloud computing service 24 of FIG. 1), to perform any or all of the above and below described functions associated with the disclosed concepts. It should be recognized that the order of execution of the illustrated operation blocks may be changed, additional operation blocks may be added, and some of the described operations may be modified, combined, or eliminated.

Method 100 begins at START terminal block 101 of FIG. 2 with memory-stored, processor-executable instructions for a programmable controller or control module or similarly suitable processor to call up an initialization procedure for a battery thermal event protocol. This routine may be executed in real-time, near real-time, continuously, systematically, sporadically, and/or at regular intervals, for example, each 10 or 100 milliseconds during regular and routine operation of the motor vehicle 10. As yet another option, terminal block 101 may initialize responsive to a user command prompt, a resident vehicle controller prompt, or a broadcast prompt signal received from an "off-board" centralized vehicle services system (e.g., host cloud computing service 24). By way of non-limiting example, the method 100 may automatically initialize in response to the detected onset of a system fault within the vehicle's high-voltage electrical system. Upon completion of some or all of the control operations presented in FIG. 2, the method 100 may advance to END terminal block 113 and temporarily terminate or, optionally, may loop back to terminal block 101 and run in a continuous loop.

From terminal block 101, method 100 advances to THERMAL RUNAWAY data input/output block 103 to determine if the detected system fault is attendant to a thermal event in at least one battery cell in the battery system being monitored. A system fault within an HV electrical system may take on innumerable types at innumerable locations depending on the contents and architecture of the system. Such system faults may include open circuit faults, short circuit faults, breaker faults, contactor faults, motor winding faults, etc. In FIG. 2, however, the method 100 provides controller-automated responses to ameliorate select thermal events within a battery system. Consequently, the thermal event response system will demarcate between systems faults associated with thermal events and systems faults unassociated with thermal events.

A representative approach for detecting a battery thermal event in the host vehicle 10 of FIG. 1 may include a resident or remove vehicle controller, such as CPU 36 of FIG. 1, prompting one or more battery system sensors, such as the CMU 76 sensor array, for sensor data indicative of a potential fault within the RESS battery pack 70. Using this sensor data, the CPU 36 derives a fault type and a fault location of the detected system fault, and concomitantly ascertains if the fault location is in at least one of the battery cells 74. If so, the CPU 36 determines whether or not the fault type is indicative of any one of multiple predefined battery thermal events. This thermal event may be a thermal runaway event in which one or more of the battery cells has entered into an uncontrolled heat-generating cycle that causes an unstable self-heating state within the cell(s). A measured temperature spike within the cells 74 of the battery pack 70, in which an in-pack ATM cooling system is unable to control, may be indicative of a thermal runaway event. It is within the scope of this disclosure that a disclosed "thermal event" include a thermal runaway event and other temperature-based events within a battery system (e.g., cooling resistance faults and internal thermal resistance faults).

Upon detection of a thermal event within the battery system, method 100 responsively monitors a surrounding area of the host vehicle to ascertain whether or not there are any vehicle users, bystanders, animals, third-party vehicles, and other potentially affected entities (collectively "target objects") near the host during the event, as indicated at TARGET DETECTION data input/output block 105. Target object detection may be accomplished via the vehicle CPU 36 of FIG. 1 prompting the digital camera(s) 62, range sensor(s) 64, and/or other resident ADAS target sensing devices for sensor data that can be pre-processed, filtered, fused and analyzed to detect, locate, and classify potential target objects. Another option includes the CPU 36 using the LRC device(s) 44 and/or SRC device(s) 46 to wirelessly connect with or otherwise sense nearby vehicles and individuals with wireless-enabled hardware or computing devices.

In a non-limiting example, the host vehicle employs BLUETOOTH®, WiFi, GPS, and other wireless technologies to detect a communications-compatible transceiver in a nearby vehicle's telematics units, a bystander's handheld computing devices, a pedestrian's smartwatch, etc. (e.g., smartphone 13 of jogger 11). Device identifiers, such as a Mobile Device Identifier (MBID), a Service Set Identifier (SSID), a Device Type Identifier (DTID), etc., may be queried to determine a target type for each target object. A unique device identifier may be retrieved wirelessly from each potential target object to indicate the type of device and, from the device type, a type of target object. For instance, if the CPU 36 detects, connects to, or pairs with a smart thermostat, smart speaker system, or in-home WiFi connection, the CPU 36 may conclude that the host vehicle is in a suburban setting and proximal to a residential home. If the host vehicle identifies many third-party vehicle usernames (e.g., MYGMC® identification information), the CPU 36 may conclude that the host vehicle is on a roadway or in a parking lot setting. CPU 36 may also leverage one or more dedicated mobile applications (app) to connect to nearby smartphones, smart wearables, handheld computing devices, e-scooter and e-bikes, etc., of passing pedestrians and bystanders. Vehicle cameras may be employed to capture outboard-facing vehicle views to determine the host vehicle's surroundings (e.g., indoors vs. outdoors, rural vs. urban, moving vs. stationary).

CPU 36 may concurrently aggregate target object data for the detected target objects, including a total number of the detected target objects, a respective location, type, and proximity for each detected target object, as well as host vehicle data, such as real-time geolocation and surroundings data of the host vehicle, thermal event type and severity, system type and specs, etc. During target object detection, the resident/remote vehicle controller may create a list of potentially impacted individuals, vehicles, building/homes, etc., nearby the thermal event. As will be explained in further detail below, the collected data may also be used to generate a list of target objects likely to be directly impacted by the event and estimate a "situational severity level" for the incident.

When attempting to detect potential targets near the host vehicle during a thermal event, input/output block 105 may attempt to delineate between: (1) nearby target objects that are distal from the host and, thus, outside a potential impact zone of the event, and (2) nearby target objects that are proximal to the host and, thus, inside the potential impact zone of the event. With continuing reference to the representative application of FIG. 1, the CPU 36 may respond to detection of one or more nearby target objects by determining a respective proximity of each detected target object to the vehicle 10 and whether or not its respective proximity is within a preset proximity limit of the vehicle 10. This preset proximity limit may be delineated by a virtual perimeter or "geofence" that is dynamically generated by the host vehicle. In at least some applications, the vehicle controller may determine an event type/severity of the thermal event and, based on the event type/severity, selectively modify a size (e.g., a diameter, width, surface area, volume, etc.) of the virtual geofence. CPU 36 concomitantly derives a total number of detected target objects as a mathematical sum of all detected target objects determined to be within the preset proximity limit of the vehicle 10 during the thermal event.

With continuing reference to the method 100 of FIG. 2, the host vehicle may take ameliorative action to protect nearby target objects during select battery thermal events, as indicated at EVENT ALERT process block 107. For instance, the vehicle CPU 36 of FIG. 1 may automatically respond to a select type of thermal event in battery pack 70 or a thermal event of a severity that exceeds a preset maximum allowable severity level by commanding one or more resident vehicle subsystems to execute one or more control operations to mitigate the ultimate effect of the thermal event. By way of example, and not limitation, the CPU 36 may push an alert through LRC and/or SRC device(s) 44, 46 to proximal target objects warning them of the thermal event and the potential effects of such event. CPU 36 may also coordinate operation of a vehicle lamp component (e.g., front and rear headlamps) and/or a vehicle display component (e.g., in-vehicle telematics unit or digital IC) to output one or more predefined visible outputs designed to alert select target objects of the thermal event. In the same vein, CPU 36 may also coordinate operation of a vehicle audio component (e.g., audio system speaker) and/or a vehicle horn component (e.g., car horn) to output one or more predefined audible outputs designed to alert select target objects of the thermal event.

At OWNER ALERT process block 109, one or more potentially impacted target objects may be prompted to transmit an alert to other interested parties. For instance, CPU 36 may transmit a thermal event alert to each target vehicle within a virtual geofence created by the host vehicle 10; each of these target vehicles, in addition to warning any present vehicle occupants, may transmit an alert to the owner of that target vehicle, to individuals near the target vehicle that are not or cannot be contacted by the host vehicle, to first responders with which the target vehicle is able to communicatively connect, etc. It is envisioned that a host vehicle may take additional or alternative remediating measures to mitigate a thermal event. Some non-limiting examples of optional remediating actions include activating an in-vehicle ATM system to cool the battery cell(s), electrically disconnecting the affected battery pack(s)/module (s)/cell(s) from all electrical loads, unlocking and/or opening the host vehicle's doors, transmitting an alert directly to the owner of the host vehicle, and/or transmitting an alert to first responders with vehicle location, event type, and event severity information. At EVENT ACTIVE decision block 111, method 100 determines whether or not the thermal event is still active (e.g., has the thermal runaway event been contained or extinguished). If so (block 111=YES), method 100 may loop back to block 105. If the thermal event is not still active (block 111=NO), method 100 may advance to terminal block 113 and temporarily discontinue.

Upon detection of a thermal event within the subject battery system (block 103) and detection of one or more target objects (block 105), method 100 may also estimate a severity level for the thermal event using collected target object data, thermal event data, and host vehicle data. Situational severity assessment may be performed locally (e.g., via resident vehicle CPU 36), remotely (e.g., via vehicle host service 24 or third-party vendor), or a combination of the two. In accord with the illustrated example, a host vehicle may connect with a BO service to transmit thereto a total number of detected target objects and a respective location of each detected target object, as indicated at SITUATIONAL SEVERITY DATA output block 115. The vehicle CPU 36 of FIG. 1, for example, may transmit the host, target, and event data via the wireless LRC device(s) 44 to the cloud computing host service 24, which may be operating as a remote subscription-based back-office (BO) vehicle services provider. During the situational severity assessment, the BO may create (or prompt the host vehicle to create) a potential impact zone around the host vehicle at HAZARD ZONE predefined process block 117. At this juncture, interested parties may be informed to not enter the potential impact zone for at least the duration of the situational severity evaluation.

Method 100 continues from process block 117 to SITUATIONAL SEVERITY EVALUATION process block 119 to determine a severity level for the thermal event using the collected target, host, and event data. To execute a situational severity evaluation, method 100 may transition to method 200 via diagram-to-diagram connector (A), which indicates an algorithm transition or "jump" from process block 119 on page 2/3 of the drawings to process block 201 on page 3/3 of the drawings. Upon completion of some or all of the operations illustrated in FIG. 3, method 200 may transition back to method 100—from process block 215 to process block 121—via connector (B). At this juncture, the vehicle CPU 36 may communicate with the BO host service 24 to receive therefrom an estimation of the situational severity level for the detected thermal event. At SITUATIONAL SEVERITY LEVEL output block 121, the derived situational severity for the detected thermal event is output to one or more interested parties, such as the host vehicle owner, target vehicle owners, first responders, etc.

Method 100 may thereafter advance from block 121 to terminal block 113 and provisionally end.

With reference next to FIG. 3, method 200 begins with aggregating the relevant data needed for conducting a severity level analysis for the detected thermal event. At SITUATIONAL SEVERITY DATA input block 201, for example, the BO service receives the total number of detected target objects, the respective locations of the detected target objects, and any other relevant target, host, and event data. At LOW SEVERITY LEVEL determination block 203, the method 200 then determines if the total number of detected target objects, namely those within the host vehicle's predefined proximity limit, is less than a first (low) threshold impact value (X). If so (block 203=YES), the method 200 proceeds to LOW SEVERITY LEVEL process block 205 and sets the situational severity level of the detected thermal event to a first (low) severity level (1). While illustrated in FIG. 3 as having four (4) possible severity levels associated with three (3) threshold impact values, it should be appreciated that the situational severity assessment may incorporate any desired number of severity levels and corresponding impact values.

If the total number of detected target objects within the host vehicle's predefined proximity limit is not less than the first (low) threshold impact value (X) (block 203=NO), method 200 proceeds to MEDIUM SEVERITY LEVEL determination block 207 and determines if the total number of detected target objects is less than a second (medium) threshold impact value (Y). In this instance, the second threshold impact value (Y) is greater than the first threshold impact value (X) (e.g., X=3; Y=7). Upon confirming that the number of detected target objects is in fact less than the second threshold impact (Y) (block 207=YES), method 200 proceeds to MEDIUM SEVERITY LEVEL process block 209 and responsively sets the situational severity level of the detected thermal event to a second (medium) severity level (2). After setting the situational severity level, method 200 advances to diagram-to-diagram connector (B) and returns to method 100.

Responsive to determining that the total number of detected target objects within the host vehicle's predefined proximity limit is not less than the second (medium) threshold impact value (Y) (block 207=NO), method 200 proceeds to HIGH SEVERITY LEVEL determination block 211 and determines if the total number of detected target objects is less than a third (high) threshold impact value (Z). In this instance, the third threshold impact value (Z) is greater than both the first and second threshold impact values (e.g., X=3; Y=7; Z=10). Upon confirming that the number of detected target objects is in fact less than the third threshold impact value (Z) (block 211=YES), method 200 proceeds to HIGH SEVERITY LEVEL process block 213 and responsively sets the situational severity level of the detected thermal event to a third (high) severity level (3). If the number of detected target objects is greater than all three threshold impact values (block 211=NO), method 200 proceeds to VERY HIGH SEVERITY LEVEL process block 215 and responsively sets the situational severity level of the detected thermal event to a fourth (very high) severity level (4).

Aspects of this disclosure may be implemented, in some embodiments, through a computer-executable program of instructions, such as program modules, generally referred to as software applications or application programs executed by any of a controller or the controller variations described herein. Software may include, in non-limiting examples, routines, programs, objects, components, and data structures that perform particular tasks or implement particular data types. The software may form an interface to allow a computer to react according to a source of input. The software may also cooperate with other code segments to initiate a variety of tasks in response to data received in conjunction with the source of the received data. The software may be stored on any of a variety of memory media, such as CD-ROM, magnetic disk, and semiconductor memory (e.g., various types of RAM or ROM).

Moreover, aspects of the present disclosure may be practiced with a variety of computer-system and computer-network configurations, including multiprocessor systems, microprocessor-based or programmable-consumer electronics, minicomputers, mainframe computers, and the like. In addition, aspects of the present disclosure may be practiced in distributed-computing environments where tasks are performed by resident and remote-processing devices that are linked through a communications network. In a distributed-computing environment, program modules may be located in both local and remote computer-storage media including memory storage devices. Aspects of the present disclosure may therefore be implemented in connection with various hardware, software, or a combination thereof, in a computer system or other processing system.

Any of the methods described herein may include machine readable instructions for execution by: (a) a processor, (b) a controller, and/or (c) any other suitable processing device. Any algorithm, software, control logic, protocol or method disclosed herein may be embodied as software stored on a tangible medium such as, for example, a flash memory, a solid-state drive (SSD) memory, a hard-disk drive (HDD) memory, a CD-ROM, a digital versatile disk (DVD), or other memory devices. The entire algorithm, control logic, protocol, or method, and/or parts thereof, may alternatively be executed by a device other than a controller and/or embodied in firmware or dedicated hardware in an available manner (e.g., implemented by an application specific integrated circuit (ASIC), a programmable logic device (PLD), a field programmable logic device (FPLD), discrete logic, etc.). Further, although specific algorithms may be described with reference to flowcharts and/or workflow diagrams depicted herein, many other methods for implementing the example machine-readable instructions may alternatively be used.

Aspects of the present disclosure have been described in detail with reference to the illustrated embodiments; those skilled in the art will recognize, however, that many modifications may be made thereto without departing from the scope of the present disclosure. The present disclosure is not limited to the precise construction and compositions disclosed herein; any and all modifications, changes, and variations apparent from the foregoing descriptions are within the scope of the disclosure as defined by the appended claims. Moreover, the present concepts expressly include any and all combinations and subcombinations of the preceding elements and features.

What is claimed:

1. A method of operating a vehicle with a battery system having multiple battery cells, the method comprising:
   detecting, via a vehicle controller, an occurrence of a thermal event in at least one of the battery cells in the battery system of the vehicle;
   monitoring, via the vehicle controller using a wireless communications device and/or a sensing device, a surrounding area of the vehicle to detect target objects, if any, near the vehicle;

determining, responsive to detecting at least one of the target objects near the vehicle, target object data including a total number of the detected target objects and a respective proximity of each of the detected target objects to the vehicle;

estimating, using the target object data, a situational severity level for the thermal event;

determining, via the vehicle controller, if the situational severity level exceeds a preset maximum allowable severity level; and transmitting, via the vehicle controller responsive to the situational severity level exceeding the preset maximum allowable severity level, a command signal to a resident vehicle subsystem to execute a control operation to mitigate the thermal event.

2. The method of claim 1, further comprising:
determining, for each of the detected target objects, if the respective proximity thereof is within a preset proximity limit of the vehicle,
wherein the total number of the detected target objects corresponds to a mathematical sum of the detected target objects determined to be within the preset proximity limit of the vehicle.

3. The method of claim 2, further comprising delineating the preset proximity limit via a virtual geofence generated by the vehicle.

4. The method of claim 3, further comprising:
determining an event type of the thermal event; and
modifying a diameter or width of the virtual geofence based on the event type of the thermal event.

5. The method of claim 2, wherein estimating the situational severity level for the thermal event includes:
determining if the total number of the detected target objects is less than a first threshold impact value; and
setting the situational severity level to a first severity level in response to the number of detected target objects being less than the first threshold impact value.

6. The method of claim 5, wherein estimating the situational severity level for the thermal event further includes:
determining, responsive to the total number of the detected target objects not being less than the first threshold impact value, if the total number of the detected target objects is less than a second threshold impact value greater than the first threshold impact value; and
setting the situational severity level to a second severity level in response to the number of the detected target objects being less than the second threshold impact value.

7. The method of claim 6, wherein estimating the situational severity level for the thermal event further includes:
determining, responsive to the total number of the detected target objects not being less than the second threshold impact value, if the total number of the detected target objects is less than a third threshold impact value greater than the second threshold impact value; and
setting the situational severity level to a third severity level in response to the total number of the detected target objects being less than the third threshold impact value.

8. The method of claim 1, wherein estimating the situational severity level for the thermal event includes:
transmitting, from the vehicle controller via the wireless communications device, the target object data to a remote back-office (BO) host service; and receiving, via the vehicle controller from the BO host service, an estimation of the situational severity level.

9. The method of claim 1, wherein the target object data further includes a host vehicle location of the vehicle and/or a respective target type for each of the detected target objects.

10. The method of claim 1, wherein detecting the thermal event includes:
receiving, via the vehicle controller from a battery system sensor, sensor data indicative of a system fault in the battery system;
determining, via the vehicle controller using the sensor data, a fault type and a fault location of the system fault; and
determining if the fault location is in the at least one of the battery cells and if the fault type is indicative of any one of multiple predefined battery thermal events.

11. The method of claim 1, wherein the detected thermal event includes a thermal runaway event in which the at least one of the battery cells is in an uncontrolled heat-generating cycle causing an unstable self-heating state.

12. The method of claim 1, wherein the resident vehicle subsystem includes a vehicle lamp component and/or a vehicle display component of the vehicle, and wherein the control operation includes the lamp component and/or the display component outputting a predefined visible output alerting the detected target objects of the thermal event.

13. The method of claim 1, wherein the resident vehicle subsystem includes a vehicle audio component and/or a vehicle horn component of the vehicle, and wherein the control operation includes the audio component and/or the horn component outputting a predefined audible output alerting the detected target objects of the thermal event.

14. A non-transitory, computer-readable medium storing instructions executable by one or more processors of a vehicle controller of a vehicle, the vehicle including a battery system with multiple battery cells, the instructions, when executed by the one or more processors, causing the vehicle controller to perform operations comprising:
detecting an occurrence of a thermal event in at least one of the battery cells in the battery system of the vehicle;
monitoring, responsive to detecting the thermal event, a surrounding area of the vehicle using a wireless communications device and/or a sensing device to detect target objects, if any, near the vehicle;
determining, responsive to detecting at least one of the target objects near the vehicle, target object data including a total number of the detected target objects and a respective proximity of each of the detected target objects to the vehicle;
estimating a situational severity level for the thermal event using the target object data;
determining if the situational severity level exceeds a preset maximum allowable severity level; and
transmitting, responsive to the situational severity level exceeding the preset maximum allowable severity level, a command signal to a resident vehicle subsystem to execute a control operation to mitigate the thermal event.

15. A vehicle, comprising:
a vehicle body;
a plurality of road wheels attached to the vehicle body;
a traction motor attached to the vehicle body and operable to drive one or more of the road wheels to thereby propel the vehicle; and a traction battery pack including a plurality of battery cells and electrically connected to the traction motor to transmit thereto electrical power; and a vehicle controller programmed to:
- detect an occurrence of a thermal event in at least one of the battery cells;
- responsive to detecting the thermal event, monitor a surrounding area of the vehicle using a sensing device and/or a wireless communications device to detect target objects, if any, near the vehicle;
- responsive to detecting at least one of the target objects near the vehicle, determine target object data including a total number of the detected target objects and a respective proximity of each of the detected target objects to the vehicle;
- estimate a situational severity level for the thermal event using the target object data;
- determine if the situational severity level exceeds a preset maximum allowable severity level; and
- responsive to the situational severity level exceeding the preset maximum allowable severity level, transmit a command signal to a resident vehicle subsystem to execute a control operation to mitigate the thermal event.

16. The vehicle of claim 15, wherein the vehicle controller is further programmed to:
determine, for each of the detected target objects, if the respective proximity thereof is within a preset proximity limit of the vehicle,
wherein the total number of the detected target objects corresponds to a mathematical sum of the detected target objects determined to be within the preset proximity limit of the vehicle.

17. The vehicle of claim 15, wherein estimating the situational severity level for the thermal event includes:
determining if the total number of the detected target objects is less than a first threshold impact value; and
setting the situational severity level to a first severity level in response to the total number of the detected target objects being less than the first threshold impact value.

18. The vehicle of claim 17, wherein estimating the situational severity level for the thermal event further includes:
determining, responsive to the total number of the detected target objects not being less than the first threshold impact value, if the total number of the detected target objects is less than a second threshold impact value greater than the first threshold impact value; and
setting the situational severity level to a second severity level in response to the total number of the detected target objects being less than the second threshold impact value.

19. The vehicle of claim 15, wherein detecting the thermal event includes:
receiving, from a battery system sensor, sensor data indicative of a system fault in the battery system;
determining, using the sensor data, a fault type and a fault location of the system fault; and
determining if the fault location is in the at least one of the battery cells and if the fault type is indicative of any one of multiple predefined battery thermal events.

20. The vehicle of claim 15, wherein the resident vehicle subsystem includes a vehicle lamp component, a vehicle display component, a vehicle audio component, and/or a vehicle horn component of the vehicle, and wherein the control operation includes outputting a predefined visible output and/or a predefined audible output.

* * * * *